United States Patent
Brunschwiler et al.

(10) Patent No.: US 9,880,595 B2
(45) Date of Patent: Jan. 30, 2018

(54) COOLING DEVICE WITH NESTED CHAMBERS FOR COMPUTER HARDWARE

(71) Applicant: International Business Machines Corporation, Armonk, NY (US)

(72) Inventors: Thomas Brunschwiler, Thalwil (CH); Ingmar Meijer, Zurich (CH); Bruno Michel, Zurich (CH); Stephan Paredes, Zurich (CH); Gerd Schlottig, Uitikon Waldegg (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/176,842

(22) Filed: Jun. 8, 2016

(65) Prior Publication Data
US 2017/0357297 A1 Dec. 14, 2017

(51) Int. Cl.
H05K 7/20 (2006.01)
G06F 1/20 (2006.01)

(52) U.S. Cl.
CPC ............. G06F 1/20 (2013.01); H05K 7/2029 (2013.01); H05K 7/2039 (2013.01)

(58) Field of Classification Search
CPC ...... G06F 1/20; H05K 7/2029; H05K 7/2039; F28D 15/00
USPC ................ 361/700; 165/104.26, 104.27, 128
See application file for complete search history.

(56) References Cited

U.S. PATENT DOCUMENTS

| | | | |
|---|---|---|---|
| 3,957,107 A * | 5/1976 | Altoz | F28D 15/06 165/104.26 |
| 4,938,279 A | 7/1990 | Betker | |
| 4,971,138 A * | 11/1990 | Lowenstein | F28D 15/02 165/104.14 |
| 5,168,921 A | 12/1992 | Meyer, IV | |
| 5,603,375 A * | 2/1997 | Salt | A41D 13/0053 165/104.26 |
| 8,534,347 B2 | 9/2013 | Denny et al. | |
| 2008/0236795 A1 | 10/2008 | You et al. | |
| 2012/0012281 A1 | 1/2012 | Franz et al. | |
| 2012/0211211 A1 | 8/2012 | Shih | |
| 2014/0240918 A1 | 8/2014 | Damaraju et al. | |

(Continued)

OTHER PUBLICATIONS

Method for a Low-Cost and Reliable Flexible Vapor Chamber for Laptop Cooling (Source: The IP.com Prior Art Database, IP.com Disclosure Number: IPCOM000008883D, Publication Date: Jul. 19, 2002; URL: https://priorat.ip.com/IPCOM/000008883).

(Continued)

Primary Examiner — Dion R Ferguson
Assistant Examiner — Mandeep S Buttar
(74) Attorney, Agent, or Firm — Harrington & Smith (57) ABSTRACT

The present invention is notably directed to a cooling device, e.g., for computer hardware. The device comprises a deformable, outer chamber, having at least one thermally conducting section, the latter suited for thermally contacting a heat source of a computer hardware. The outer chamber is deformable upon a pressure increase therein. The cooling device further comprises at least one inner chamber nested in the outer chamber, the inner chamber expandable in volume upon a pressure increase therein. The invention is further directed to a computer hardware apparatus comprising such a cooling device, or stacks of such cooling devices paired with respective set of electronic components.

18 Claims, 4 Drawing Sheets

(56) References Cited

U.S. PATENT DOCUMENTS

2015/0027668 A1  1/2015  Yang
2015/0346784 A1  12/2015  Delano et al.

OTHER PUBLICATIONS

Method for a Lattice-Structured IHS with an Embedded Metal-Foam Vapor Chamber (Source: The IP.com Prior Art Database, IP.com Disclosure Number: IPCOM000136901D, Publication Date: Jun. 5, 2006; URL: https://priorart.ip.com/IPCOM/000136901)

Method for a Vapor Chamber With a Liquid Metal and Water Mixture (Source: The IP.com Prior Art Database, IP.com Disclosure Number: IPCOM000137846D, Publication Date: Jun. 28, 2006, https://priorart.ip.com/IPCOM/000137846).

Xiao Ping Wu, Masataka Mochizuki, Thang Nguyen, Yuji Saito, Vijit Wuttijumnong, Horia Ghisoiu, Vichan Kumthonkittikul, Parichart Sukkasaem, Pichit Nimitkiatklai and F. Kiyooka Low Profile-High Performance Vapor Chamber Heat Sinks for Cooling High-Density Blade Servers, 23rd IEEE Semi-Therm Symposium: 2007 IEEE.

* cited by examiner

COOLING DEVICE WITH NESTED CHAMBERS FOR COMPUTER HARDWARE

BACKGROUND

The invention relates in general to the field of cooling devices for computer hardware. In particular, it is directed to a cooling device comprising deformable sections, which thermally contact components of the computer hardware upon deforming.

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section.

Computer cooling is needed to remove heat produced by computer components and keep such components operating within acceptable temperature limits. Various cooling techniques are known, e.g., air- or liquid-based. Although more complex to implement, liquid cooling is more efficient, making it suitable for high performance computer applications.

In a stacked system of liquid-cooled, high-power density electrical components (e.g., server, microserver, or high performance systems), removing heat without applying additional, load forces is usually insufficient. Given that there is no space left for force elements around each cold plate or vapor chamber, the force need be provided by in-series stacking of the elements, to obtain a suitable thermal contact. Yet, the elements stacked cannot be released without releasing the force in neighboring elements, which impairs replacement of a single element, e.g., a single printed circuit board (or PCB). Rework can only be done for a series of PCBs.

In many high power density electrical components, additional thermal load activation is achieved manually, e.g., by screwing on springs. This is bound to human error during manufacturing, which may reach 1/100. Such errors require field reworks.

Cooling systems are known, which use flexible sections in heat pipes or vapor chambers, see e.g., U.S. Pat. No. 4,938,279, U.S. Pat. No. 8,534,347 and U.S. Pat. No. 5,168,921. Several liquids may be involved in the heat pipes or vapor chambers, as discussed in US 2008/0236795 A1.

SUMMARY

This section is intended to include examples and is not intended to be limiting.

According to one embodiment, a cooling device is provided comprising: a deformable, outer chamber comprising at least one thermally conducting section, suited for thermally contacting a heat source, wherein the outer chamber is deformable upon a pressure increase therein; and at least one inner chamber nested in the outer chamber, the inner chamber expandable in volume upon a pressure increase therein.

According to another embodiment, a computer hardware apparatus is provided comprising a support with at least one electronic component, and at least one cooling device as described above, wherein said at least one thermally conducting section is in thermal communication with said at least one electronic component.

BRIEF DESCRIPTION OF SEVERAL VIEWS OF THE DRAWINGS

FIGS. 2A and 2B are 2D cross-sectional views of the same device as in FIG. 1, illustrating how the latter deforms to increase thermal contact with a computer hardware component, in operation. FIG. 2B shows the device rotated with respect to axis z, for the sake of depiction;

The accompanying drawings show simplified representations of devices or parts thereof, as involved in embodiments. Technical features depicted in the drawings are not to scale, for the sake of understanding. Similar or functionally similar elements in the figures have been allocated the same numeral references, unless otherwise indicated.

DETAILED DESCRIPTION OF EMBODIMENTS OF THE INVENTION

In reference to FIGS. 1-8, an aspect of the invention is first described, which concerns a cooling device 10, 10a designed for cooling a heat source of, e.g., a computer hardware 1-1c. Basically, the cooling device 10, 10a comprises an outer chamber 12 and at least one inner chamber 11, nested in the former. The inner and outer chambers form, each, an enclosed space or cavity.

The outer chamber 12 is deformable; it comprises at least one thermally conducting section $S_d$. The latter is suitably dimensioned and arranged, so as to be able to thermally contact a heat source 25 of a device 1-1c. The outer chamber 12 is deformable upon the pressure increasing therein. The deformation of the outer chamber 12 may take place as part of a global volume expansion of the outer chamber 12, or may result from a local deformation, in the sense that only one or more local portions $S_d$ of the chamber 12 may deform, as illustrated in FIGS. 2-4.

The inner chamber(s) 11 is(are) nested in the outer chamber 12. Each inner chamber 11 is expandable (in volume), upon the pressure increasing therein, which allows, in turn, the outer chamber 12 to deform.

In practice, the expansion of the inner chamber 11 is triggered after the cooling device 10, 10a has been inserted in an apparatus 1-1c (as depicted in FIGS. 5-8), to provide the desired force load on the cooled components 25.

Figures 2A, 2B:
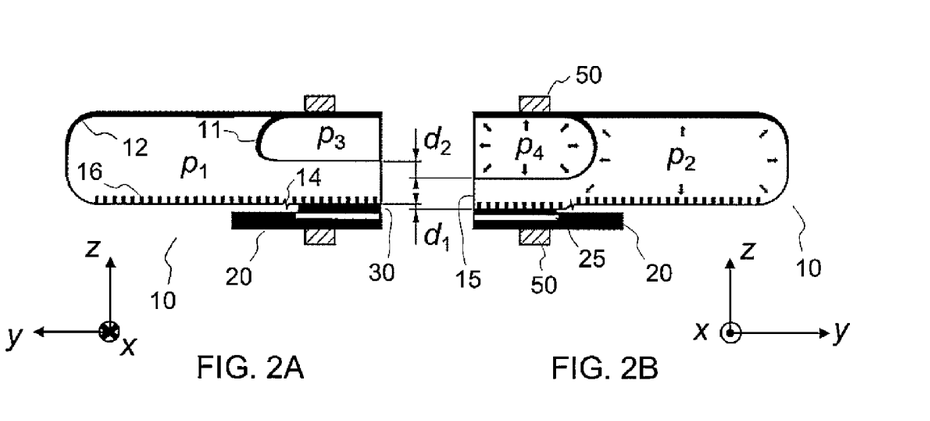
Figure 2C:
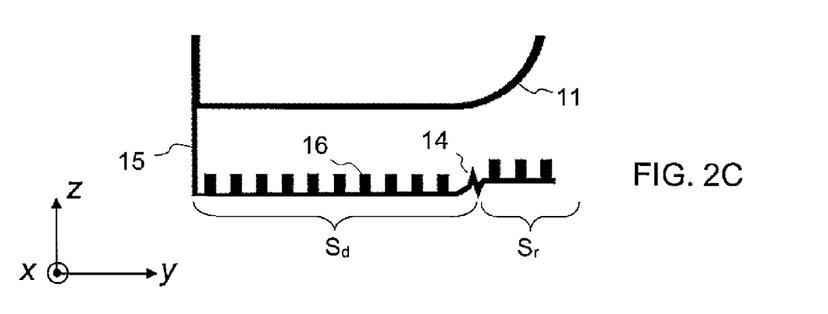
FIG. 2C is a close-up view of FIG. 2B, showing how a given section deforms with respect to a remaining section of the outer chamber, as involved in embodiments.
Figure 3A:
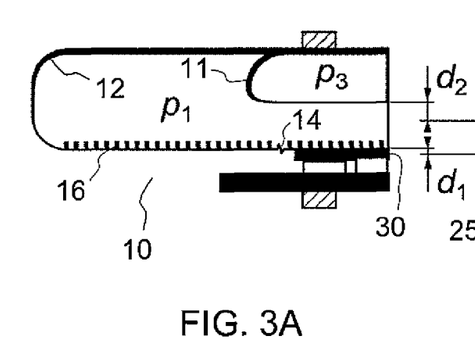
FIGS. 3A and 4A are 2D cross-sectional views of example cooling devices according to embodiments, and illustrate the deformation of deformable sections of the outer chamber, in operation.
Figure 3B:
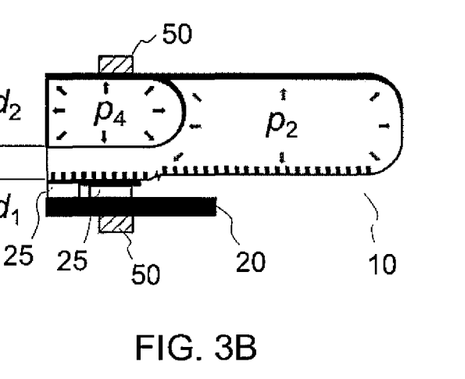
FIGS. 3B and 4B show the devices rotated with respect to axis z, respectively.
Figure 4A:
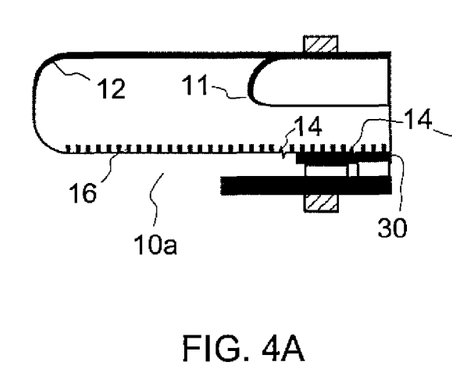
Figure 4B:
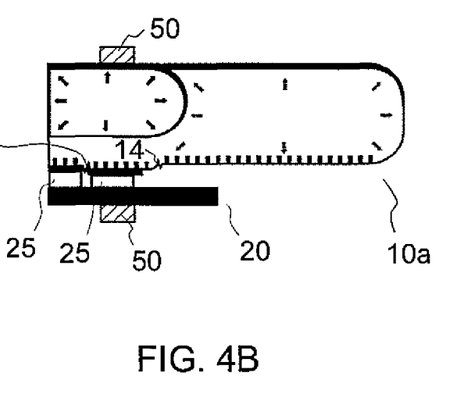

The deformation of the outer chamber 12 allows to adaptively increase thermal contact, e.g., by reducing the bond line thickness of a thermal interface material 30 (a heat exchanger material), such as a thermal pad, upon compression by the deformed chamber 12, as for instance illustrated in FIGS. 2B, 3B and 4B.

Different mechanisms may compete to increase the pressure in the outer chamber 12. In all cases, the deformation of the outer chamber 12 results from a pressure increase therein. The latter may primarily be due to the expansion of the inner chamber 11, within the outer chamber 12. In addition, the pressure increase in the outer chamber 12 may be supported by liquid evaporating therein, which may further result in increasing the thermal conductivity of the device 10, 10a. In addition, the expansion of the inner chamber 11 may be caused by liquid contained therein, which liquid evaporates as the temperature of the hardware increases, in operation. All such variants are described below in detail.

The heat sources are typically electronic components, e.g., integrated circuits such as memory cards, CPUs, GPUs or graphics cards, chipsets and hard disk drives of some computer hardware 1-1c. More generally, the heat sources may be any component susceptible to malfunction if overheated. In addition, the heat sources may be an electronic device, e.g., power electronics. Also, the present cooling devices may be used to cool a chemical reactor. The following description assumes that the heat source is some computer hardware 1-1c, for the sake of illustration.

There are typically several heat sources, e.g., arranged side by side on a support 20 such as a carrier board or any type of printed circuit board (PCB). The outer chamber 12 may possibly comprise several sections $S_d$ to thermally contact each of the heat sources, or groups thereof, as explained later in reference to FIG. 4B. In variants, a single conducting section $S_d$ may come in close contact with several heat sources, via one or more thermal interfaces 30, which may furthermore be configured to compensate for the different heights or heat waste needs of the components, if necessary.

The present solutions involve nested, deformable chambers, which inherently provide the required force load on the cooled elements, without requiring any manual load adjustment. In other words, it provides an adaptive coldplate, comprising an outer chamber, which can deform (after insertion) to increase thermal contact with the heat source, and an inner chamber that can expand inside the outer chamber to increase pressure in the latter.

No additional external force elements or force application tools are needed, beyond fixtures 50, such the upper and lower fixtures 50 depicted in FIGS. 1-4. Thus, cooling devices 10, 10a and computer hardware elements (e.g., a PCB 20 with components 25 mounted thereon) can be directly inserted in the computer hardware apparatus. In variants, cooling devices 10, 10a can be paired with respective hardware elements before being inserted in an apparatus. In all cases, several dual units can be stacked in the apparatus. No or few manual action is needed after insertion. As it can be realized, such an approach not only reduces (or suppresses) the need for field rework, but it may furthermore result in lowering the initial assembly cost.

The deformations of the outer chamber 12 are preferably constrained so as to occur along one direction only, i.e., along z in the accompanying drawings. This is especially preferred in stacked arrangements, where dual units are stacked. This way, the deformation of the cooling device 10, 10a and the resulting load force impacts only a contiguous set of components 20, 25, i.e., the components paired with said cooling device. Neighboring components (e.g., in an upper or lower dual unit) are not necessarily impacted. Thus, a dual unit can be mounted in an apparatus and fixed 50, independently from other, stacked elements. All the more, a single hardware element (or a single dual unit) can, if necessary, be removed in isolation from any other element or unit, i.e., the present solution allows isolated removal of single PCBs (or paired cooling units and respective PCBs) in stacked assemblies.

In embodiments, the thermally conducting section $S_d$ is deformable, so as to confer the deformability property of the chamber. The section $S_d$ is deformable upon a pressure increase in the outer chamber 12. Thus, the deformation of the outer chamber 12 is limited to the deformation of the section $S_d$, to allow to focus cooling on a specific electronic component (or group of components) that waste heat. Such a solution requires lower pressure gradients for the cavity 12 to deform, all things being otherwise equal. As further evoked above, the deformation of the outer chamber 12 is preferably constrained to take place along one direction only. I.e., the deformable section typically exhibits a flat surface coming in thermal contact with a respective electronic component, or group of components, possibly via a thermal interface material 30, as explained later.

A deformable section $S_d$ may be connected to a remaining section $S_r$ of the outer chamber 12 via one or more hinges 14, as illustrated notably in FIGS. 2C, 4A-4B, and 8. The remaining section $S_r$ is not deformable or, at least, is substantially less deformable than a deformable section $S_d$. Note that, here, the section $S_d$ is said to be deformable inasmuch as it comprises hinges 14 that allow the desired deformation. However, the remaining (e.g., flat) surface of the deformable section $S_d$ need not be deformable, even if it might be, in embodiments.

Figure 8:
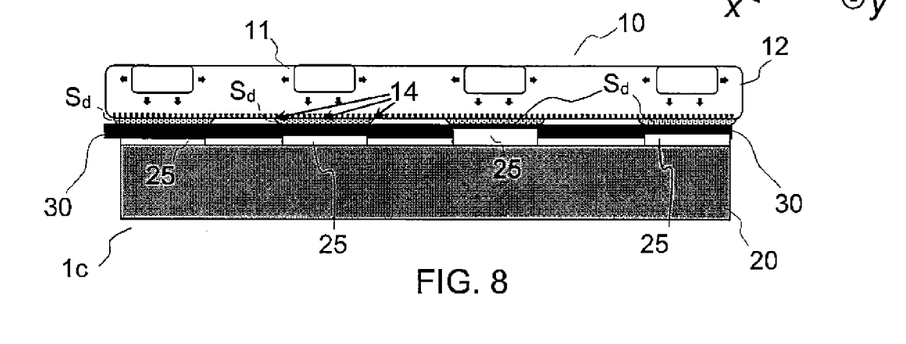

As further illustrated in FIGS. 4A-4B and 8, the outer chamber 12 may comprise several deformable sections $S_d$. I.e., the chamber 12 may comprise a set of thermally conducting, deformable sections $S_d$, suitably arranged for thermally contacting respective heat sources 25 of a computer hardware. As said earlier, heat sources are typically electronic components, e.g., memory cards, GPU, CPU, etc., or groups of such components. The components are, e.g., arranged side by side on a support 20 such as a PCB. Thus, the deformable sections $S_d$ may be correspondingly arranged along one or more directions x, y, or so as to span a bi-dimensional surface, as necessary to thermally contact the electronic components 25 of the hardware.

Each of said deformable sections $S_d$ may be connected to a remaining section $S_r$ of the outer chamber 12 via one or more hinges 14. Again, the remaining section $S_r$ is substantially less deformable than each of said deformable sections $S_d$.

In FIGS. 4A-B, two deformable sections $S_d$ are shown, which are shifted along direction y, whereas in FIG. 8 the sections $S_d$ are laterally shifted along direction x, it being noted that the sections may actually be distributed over an area in a plane parallel to (x, y), as necessary to thermally contact an arrangement of electronic components.

In embodiments, the hinges 14 may be concertinaed or otherwise designed as bellows, i.e., having an accordion structure, as suggested by the depiction of the hinges 14 in FIGS. 1-4, so as to allow a vertical extension of the sections $S_d$ delimited or bordered by such hinges 14. In variants, one may use elastic, material hinges 14, whose thicknesses are typically reduced in comparison with an average thickness of the neighboring material forming the outer chamber 12. The hinges may be formed from a different material than the neighboring material, especially if elastic hinges are used. Concertinaed hinges may be formed of the same material. Other types of hinge mechanisms may involve elements such as disclosed in e.g., U.S. Pat. No. 4,938,279, U.S. Pat. No. 8,534,347 and U.S. Pat. No. 5,168,921.

In general, one shall prefer hinges that are easily compatible with the technology of implementation, e.g., made of the same material as the rest of the chamber wall, modified locally by a process step such as embossing, stamping, etc. Thus, hinges obtained as locally thinned regions and bellow structures are preferred. Yet, more elaborate solutions may rely on soldered or braced inserts.

As the chambers 11, 12 need be gastight and that hinges 14 may compromise the tightness, one or more other, expandable chambers or balloons (not shown) may be provided between the inner chamber 11 and the outer chamber shell 12 to main tightness, if necessary.

The axes of the hinges 14 may extend along one or more directions, or within a plane, parallel to the lower surface of the outer chamber 12, e.g., the surface on which thermal pads 30 are provided and which comes in thermal contact with the electronic components 25. This allows the sections $S_d$ to expand perpendicularly to said lower surface.

Only one, continuous hinge may suffice to provide the desired deformability for a single section $S_d$. The line of extension of the hinge may draw a closed shape, typically a convex set, e.g., a convex polygon square, rectangle, etc., a circle, an ellipse or an oblong shape. In variants, the hinge may extend along an open shape, e.g., a circular arc if the section $S_d$ is arranged at an edge of the lower plane of the outer chamber, as assumed in FIGS. 1-4. In FIGS. 1-4 (see in particular FIG. 2C), the cooling devices comprises a back wall 15 that is extensible. For example, the lower part of the back wall 15 may be concertinaed, in a similar manner as the hinges 14 are, so as to enable extension of the sections $S_d$.

The average thickness of the material forming the shell of the outer chamber 12 shall typically be between 50 μm and 1000 μm. This material can for instance be a metal alloy, providing adequate thermal conductivity, such as a copper alloy, or an aluminum-based alloy.

Figure 1:
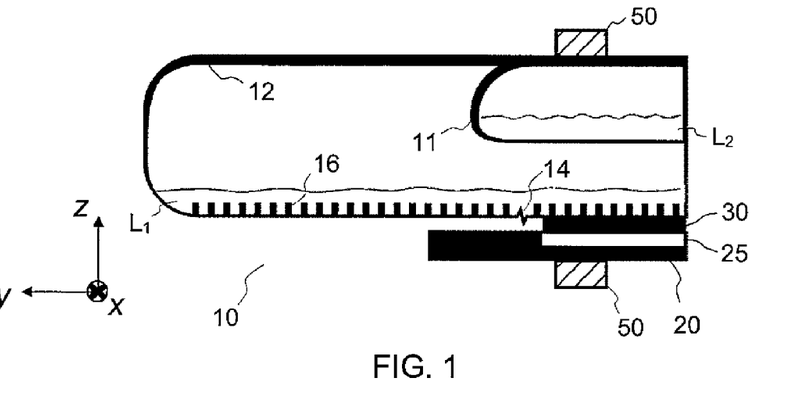
FIG. 1 is a 2D, cross-sectional view of a cooling device, according to embodiments.

Referring now more specifically to FIG. 1, the outer chamber 12 may, in embodiments, comprise a liquid $L_1$ (hereafter called "first liquid"), having a "first boiling point", at which the first liquid $L_1$ changes into a "first vapor". When evaporating, the liquid $L_1$ contributes to increase pressure in the outer chamber 12.

Similarly, the inner chamber 11 may comprise a "second liquid" $L_2$, having a "second boiling point", which is lower than the first boiling point. When the temperature within the inner chamber 11 reaches said second boiling point, the second liquid $L_2$ changes into a "second vapor" to thereby increase pressure in the inner chamber 11. Pressure accordingly passes from $p_3$ to $p_4$, as illustrated in FIGS. 2-3, whereby the inner chamber 11 expands in volume. The minimal distance between the inner chamber 11 and the deformable sections passes from $d_1$ to $d_2$. The volume expansion of the inner chamber 11 and the evaporation of the first liquid $L_1$ shall each contribute to increase pressure (from $p_1$ to $p_2$) in the outer chamber 12 such that the latter expands towards the heat source 25, thereby compressing the thermal interface layer 30, and improving the thermal contact. Liquids $L_1$ and $L_2$ are not represented in FIGS. 2-8, for conciseness.

The deformation/expansion of the chambers 11, 12 is not only defined by the liquids, and the (changes in) temperatures and pressures, but also by the design of the chambers 11, 12 and the propensity (e.g., the stiffness) of materials used therefor to deform expand. In particular, the deformation/expansion of the outer chamber 12 will be impacted by the propensity of the deformable section(s) $S_d$ to deform or expand and by the properties of the hinges 14. Thus, the properties of the chambers 11, 12 are defined by a combination of material properties and geometry.

In embodiments where the outer chamber is expansible (and not merely deformable), the expandable area(s) of the outer chamber 12 is(are) preferably less stiff than the expandable area(s) of the inner chamber 11. More generally, the outer chamber should exhibit more propensity to deform than the inner chamber 11. This way, when the pressure in the outer chamber 12 increases, the latter can deform so as to more favorably act towards the deformable section $S_d$. Indeed, if the outer chamber 12 is made too stiff with respect to the inner chamber 11, the latter may deform, in reaction to pressure increasing in the outer chamber 12, so as to reach an equilibrium, and without it being possible for the outer chamber 12 to deform sufficiently for the purpose of acting towards the deformable section $S_d$ and thereby improve thermal contact.

For reasons that will become apparent below, the difference between said second boiling and said first boiling point is preferably between 20 C and 40 C, and more preferably between 25 C and 35 C, e.g., it may for instance be of 30 C.

In addition, the first boiling point is preferably between 50 C and 120 C. Still, one may need it to reach 200 C in power electronics. The first liquid may for instance comprise Acetone, Hexane-n, ethanol or methanol, Isopropyl, n-propyl alcohol, Cyclohexane, or possibly a solution thereof.

The second boiling point is preferably between 20 C and 40 C. This liquid may for instance comprise Acetaldehyde, Diethyl ether, or Pentane-n.

For example, the first liquid in the outer chamber may have a boiling point of $T_a+40$ C, where $T_a$ denotes the ambient temperature expected in operation. Meanwhile, the second liquid in the inner chamber 11 may have a boiling point of $T_a+10$ C, i.e., the boiling points of the two liquids differs by 30C in that case. In operation, when the temperature in the inner chamber 11 reaches $T_a+10$ C, the second liquid in the inner chamber 11 goes from the liquid phase to the gas phase. This results in a volume expansion of the inner chamber 11 and concomitantly an increase of the gas pressure in the outer vapor chamber 12 (e.g., from FIG. 2A to 2B). The outer chamber 12 will accordingly expand, thereby causing the thermal interface material 30 to reduce thickness at the level of the compression area. This in turn, causes to achieve thermal contact or increase the area of thermal contact between the vapor chamber 12 and the heat source 25.

Next, when the outer chamber 12 reaches a temperature of $T_a+40$ C, the first liquid evaporates. This contributes to increase the pressure in the outer chamber 12. The latter accordingly expands towards the thermal interface 30, the thermal interface thickness decreases, which increases thermal conductivity from the heat source 25, through the thermal interface 30 and the outer chamber 12 up to liquid $L_1$. In addition, the evaporation of the liquid $L_1$ may result in increased heat transfer between the heat source 25 and a heat sink (not shown), thermally connected to the cooling device 10, 10a, due to a vapor chamber effect, thereby utilizing the latent heat transferred to the liquid upon evaporation.

In the above embodiment, it is assumed that the temperature increase makes the liquid $L_2$ reach its boiling point first. As a result, the inner pressure increases and the inner volume 11 increases, so that the inner chamber expands in the outer chamber. Thus, the outer chamber 12 expands or deforms (locally) towards the heat source, thereby establishing good thermal contact. Then, when liquid $L_1$ in the outer chamber 12 reaches its boiling point, the pressure in the outer chamber 12 further increases and the latter further expands or deforms. A two-step deformation of the outer chamber is thereby achieved.

The accompanying drawings assume that the residual volume available in the outer chamber 12 for liquid $L_1$ is larger than the inner volume of the inner chamber. This, however, need not be necessarily the case. Indeed, in variants, the inner chamber may be designed to have a larger volume than the residual volume for liquid $L_1$ in the outer chamber. As the one skilled in the art may realize, this would allow a design where the liquid $L_1$ has a lower boiling point than the liquid $L_2$, which would nevertheless yield a two-step deformation as in the above example. Note that the composition of the liquid $L_1$ may be devised in view of optimizing a pressure increase in the outer chamber 12, or in view of optimizing the thermal conductivity increase. If possible, these two properties can be jointly optimized.

In general, and as illustrated in FIGS. 1-8, present cooling devices 10, 10a may comprise at least one compressibly deformable thermal interface material 30, attached to the outer chamber 12, so as to allow the section $S_d$ to thermally contact the heat source 25. "Compressibly deformable" means that the thermal interface 30 can be deformed in compression, along a direction of interest (here along −z). While the thickness of the material 30 contracts when put into uniaxial compression (FIGS. 5-8), the contraction is not necessarily accompanied by a lateral expansion, perpendicularly to the compression axis, especially if the material 30 comprises a foam material or the like. Thermal pads are known which provide adequate thermal conductivity. Examples of suitable materials 30 include metal flake enhanced adhesives, such as silver flake containing epoxies, silicones, gels or greases, or preforms made of polymer-bound graphite fibers.

Many different scenarios can be contemplated. For example, distinct thermal interfaces 30 may be provided for each component 25 (or group of neighboring components 25), as assumed in the embodiment of FIG. 5. This way, the thickness of the thermal interfaces 30 can be adapted, to compensate for different heights and/or heat wastes of the components 25. In variants, a single thermal pad 30 may be provided for several components, as assumed in FIGS. 3-4 and 6-8. Yet, the material 30 may be compressible enough so as to compensate for the different heights of the components 25.

In the embodiment of FIGS. 3A 3B and 6-7, a single, deformable section $S_d$ is provided for applying thermal contact to distinct components 25. Difference in heights are compensated by the thermal interface 30. In FIGS. 4A-4B, distinct sections $S_d$ are provided, to specifically contact distinct components. Distinct thermal interface pads 30 may be used, or not.

Such variants will be further explored in reference to FIGS. 5-8. According to another aspect, the invention can be embodied as a computer hardware apparatus 1-1c. The latter basically comprises a support 20, comprising at least one (but typically more) electronic component 25. Present apparatuses further comprise at least one cooling device 10, 10a such as described earlier in reference to FIGS. 1-4. In particular, one or more thermally conducting sections $S_d$ are in thermal communication with one or more electronic components 25.

The support 20 can be a rigid or flexible carrier board, or any type of printed circuit board (PCB) or other carrier of electronical components, such as ceramic carriers, having one or more electronic components 25 thereon, as assumed in FIG. 5-8. In variants, the support 20 may be an overmold 20, wherein one or more components 25 are overmolded, as assumed in FIGS. 1-2. The overmold may form or be part of any kind of partly or fully encapsulated package, such as an overmolded leadframe package (with or without exposed pads), an embedded wafer level package or any chip scale package, or a stack of packages.

Figure 5:
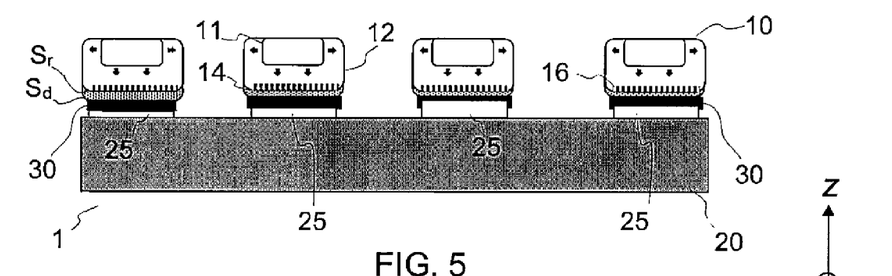
FIGS. 5-9 illustrate various embodiments of computer hardware apparatuses (front views) comprising cooling devices, according to embodiments.

As illustrated in FIG. 5, present apparatuses 1 may comprise several, similar cooling devices 10, which may possibly differ in size or otherwise have different characteristics, to accommodate distinct components 25 (or groups thereof), leading to distinct heat wastes. As evoked earlier, distinct thermal interfaces 30 may possibly be provided too.

Figure 6:
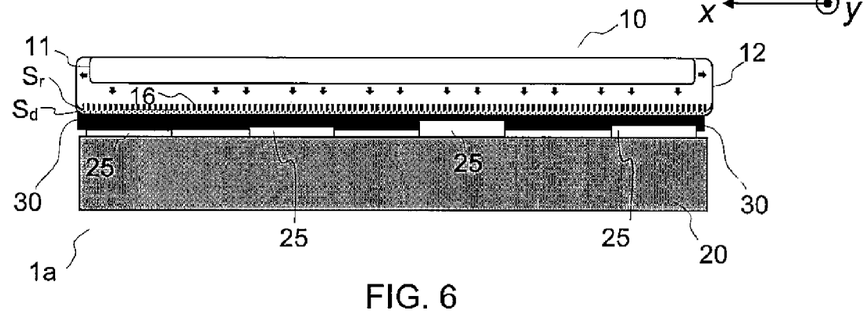
Figure 7:
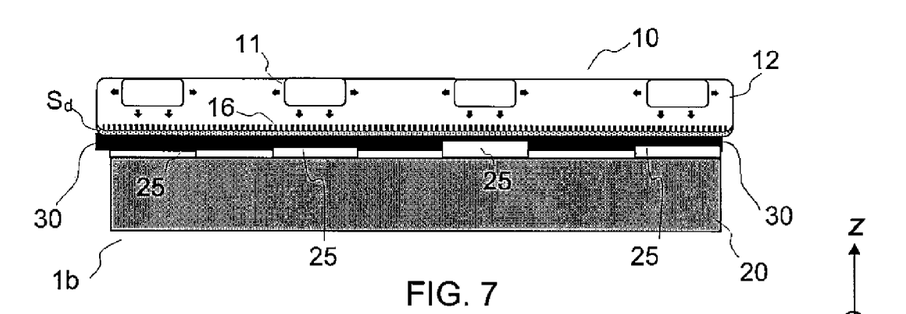

Referring to FIGS. 6-7, in embodiments, the computer hardware apparatus 1a, 1b comprises a cooling device 10 wherein a single deformable section $S_d$ is connected to a remaining section $S_r$ of the outer chamber 12, via one or more hinges 14. As discussed earlier, the remaining section is not deformable or substantially less deformable than the deformable section.

The apparatus 1a, 1b may further comprise a single thermal interface pad 30. The latter is preferably attached (e.g., glued) to the outer chamber 12 of the cooling device 10, vis-à-vis the deformable section $S_d$. Thus, the deformable section $S_d$ is in thermal communication with the electronic components 25 via the thermal interface material 30. As explained earlier, the section $S_d$ is deformable upon a pressure increase in the outer chamber 12, so as to compress a portion of the thermal interface 30 at the level of a respective electronic component 25 (or a group of components).

Only one inner chamber 11 may be provided, as in FIG. 6. In variants, several inner chambers may be provided, as in FIG. 7. This way, cooling devices 10 may be tailored according to specific layouts of components, wherein only the external shell 12 need be adapted. The number of inner chambers (each having the same dimensions) is adapted, as needed to achieve the necessary pressure increase in the tailored shell 12.

In other embodiments, FIG. 8, the apparatus 1c may involve a cooling device 10 that comprises a set of deformable sections $S_d$. Each of the sections $S_d$ is in thermal communication with a respective one of the electronic components 25 (or a group thereof), via a respective portion of the thermal interface 30. Each deformable section $S_d$ is furthermore deformable, so as to compress a respective portion of the thermal interface 30 at the level of a respective one of the electronic components 25, to achieve a suitable thermal contact or increase thermal contact.

In still other embodiments, aspects of FIGS. 5-8 may be combined, e.g., to achieve a computer hardware apparatus, wherein the cooling device 10 involves distinct deformable sections, as well as distinct thermal interfaces 30. The latter may be attached to the outer chamber 12 vis-à-vis each of the deformable sections $S_d$. Thus, in general, each deformable section $S_d$ is in thermal communication with one or more of the electronic components 25 via one or more thermal interfaces 30 (or one or more portions of a single thermal interface 30).

In all cases, the present cooling devices 10, 10a may comprise a wicking structure 16, to improve thermal exchanges. For example, the outer chamber 12 may comprise a wicking structure 16 extending over an inner area of the outer chamber 12, as assumed in the accompanying drawings. Said inner area shall typically be vis-à-vis the deformable sections $S_d$ and span a corresponding area, or a larger area.

Present apparatuses may typically be embodied as a stacked system 1d of liquid-cooled, high-power density electronic components, e.g., such as server or microserver, or a high performance computer apparatus. More generally, present apparatuses 1d may comprise a stack of at least two supports 20, e.g., PCBs, each having one or more electronic components 25 thereon. Note that FIGS. 1-8 depicts only one level in the stack, i.e., involving a lateral arrangement of one or more cooling devices thermally paired with a lateral arrangement of one or more components 25. Yet, several levels of paired units 10-20, 25 may be stacked along axis z, as exemplified in FIG. 9, which shows several paired units (each as in FIG. 6), vertically stacked.

Figure 9:
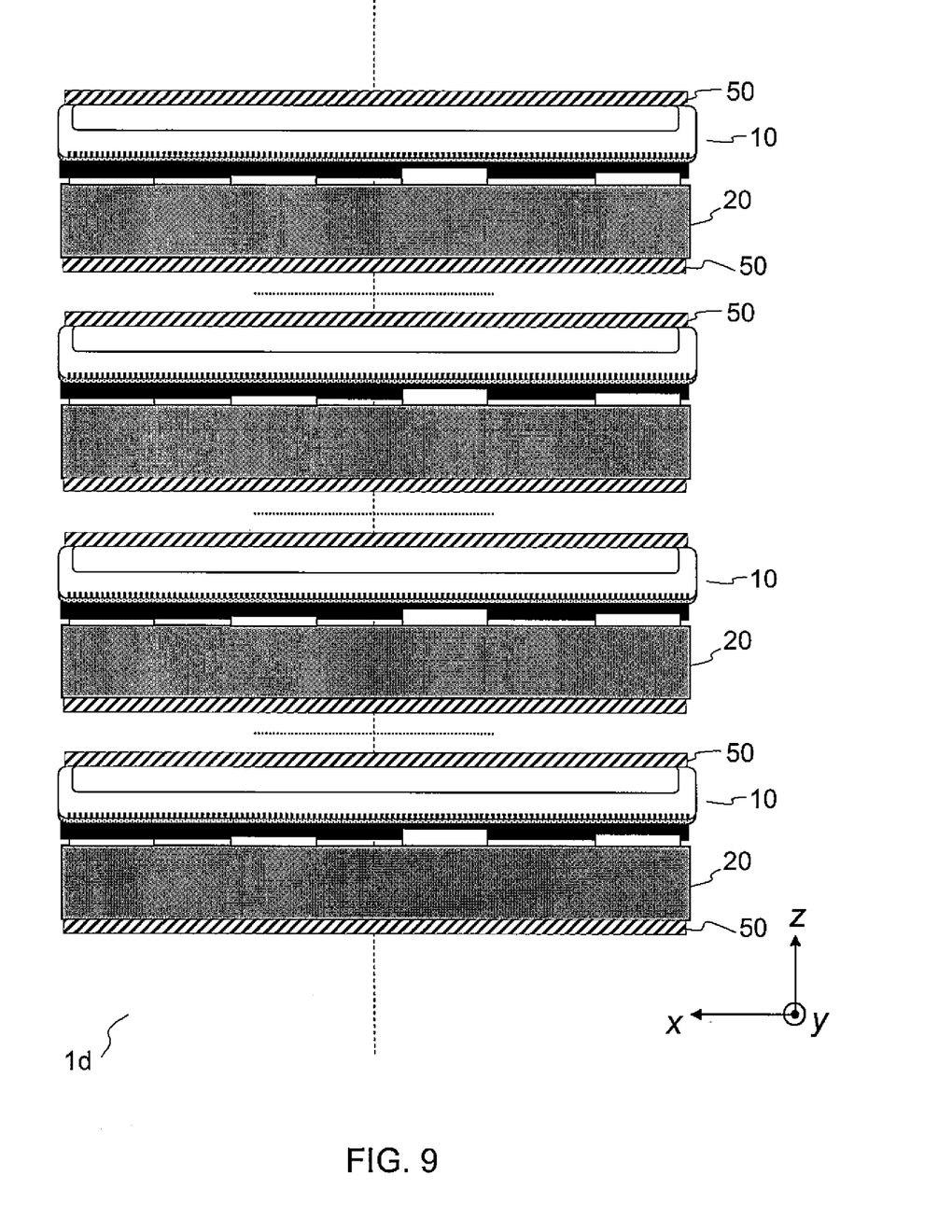

Thus, an apparatus 1d may comprise one or more cooling devices 10, 10a in each level of the stack. In FIG. 9, each level is delimited by horizontal, dotted lines. Thus, at each level of the stack, at least one thermally conducting section $S_d$ of at least one cooling device 10, 10a will be in thermal communication with one element (this element comprising one or more electronic components 25 arranged on or in a supports 20). Owing to advantages discussed in respect to present cooling devices, each element may be mounted in the apparatus, together with its corresponding (set of) cooling device(s), so as to be removable in isolation from other elements or cooling devices in other levels of the stack. This drastically simplify replacement of single elements.

According to one embodiment, a cooling device is provided, e.g., for a heat source, such as a heat source from computer hardware, an electronic device, or a chemical reactor. The device comprises a deformable, outer chamber, having at least one thermally conducting section, the latter suited for thermally contacting a heat source. The outer chamber is deformable upon a pressure increase therein. The cooling device further comprises at least one inner chamber nested in the outer chamber, the inner chamber expandable in volume upon a pressure increase therein.

In embodiments, said at least one section is a thermally conducting, deformable section, and is deformable upon a pressure increase in the outer chamber.

The at least one deformable section comprises one or more hinges and is connected to a remaining section of the outer chamber via said one or more hinges, said remaining section being substantially less deformable than said at least one deformable section. The hinges may for instance be concertinaed.

In embodiments, the outer chamber comprises a set of thermally conducting, deformable sections, wherein each of said deformable sections comprises one or more hinges and is connected to a remaining section of the outer chamber via said one or more hinges. The deformable sections are suitably arranged for thermally contacting respective heat sources.

In embodiments, one, or each of the outer chamber and inner chamber may comprise a liquid. The outer chamber may for instance comprise a first liquid having a first boiling point, at which the first liquid changes into a first vapor. This liquid may contribute to increase pressure in the outer chamber and the thermal conductivity of the device. In addition, the inner chamber may also comprise a liquid. If each of the outer chamber and inner chamber comprises a liquid, then the second liquid (in the inner chamber) preferably has a second boiling point that is lower than the first boiling point. When temperature reaches the second boiling point, the second liquid changes into a second vapor to thereby increase pressure in the inner chamber, so as to expand the latter in volume and increase pressure in the outer chamber.

According to another embodiment, the invention is embodied as a computer hardware apparatus. This apparatus comprises a support with one or more electronic components, and at least one cooling device such as the cooling device described above. At least one thermally conducting section of the cooling device is in thermal communication with said electronic components.

In embodiments, such an apparatus may comprise: a stack of at least two supports, each having at least one electronic component; and at least one cooling device such as discussed above. At least one thermally conducting section of the cooling device is in thermal communication with at least one electronic component of one of the two supports. Each of the two supports is mounted in the apparatus, together with the cooling device, so as for said one of the two supports and the cooling device to be removable in isolation from the other one of the two supports.

While the present invention has been described with reference to a limited number of embodiments, variants and the accompanying drawings, it will be understood by those skilled in the art that various changes may be made and equivalents may be substituted without departing from the scope of the present invention. In particular, a feature recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly discussed above can be contemplated. For example, aspects of FIGS. 2-8 may be combined to achieve other arrangements of inner chambers vs. outer chamber, or deformable sections vs. electronic components or, still, of thermal interfaces vs. deformable sections and electronic components, etc. In addition, other materials may be used for the inner and outer chambers, etc.

What is claimed is:

1. A cooling device, comprising: a deformable, outer chamber comprising at least one thermally conducting section, suited for thermally contacting a heat source, wherein the outer chamber is deformable upon a pressure increase therein; and at least one inner chamber nested in the outer chamber, the inner chamber expandable in volume upon a pressure increase therein; and wherein said at least one section is a thermally conducting, deformable section, and is deformable upon a pressure increase in the outer chamber; wherein the at least one deformable section comprises one or more hinges and is connected to a remaining section of the outer chamber by said one or more hinges, said remaining section being substantially less deformable than said at least one deformable section.

2. The cooling device according to claim 1, wherein said outer chamber comprises a set of thermally conducting, deformable sections, wherein: each of said deformable sections comprises one or more hinges and is connected to the remaining section of the outer chamber by said one or more hinges, said remaining section being substantially less deformable than each of said deformable sections; and said deformable sections are suitably arranged for thermally contacting respective heat sources.

3. The cooling device according to claim 1, wherein said one or more hinges are concertinaed.

4. The cooling device according to claim 1, wherein
the outer chamber comprises a first liquid having a first boiling point, at which the first liquid changes into a first vapor, so as to increase the thermal conductivity of the outer chamber.

5. The cooling device according to claim 1, wherein
the inner chamber comprises a second liquid having a second boiling point that is lower than the first boiling point, at which second boiling point the second liquid changes into a second vapor to thereby increase pressure in the inner chamber, so as to expand the latter in volume and increase pressure in the outer chamber.

6. The cooling device according to claim 5, wherein:
the outer chamber comprises a first liquid having a first boiling point, at which the first liquid changes into a first vapor; and
a difference between said second boiling and said first boiling point is between 20 C and 40 C.

7. The cooling device according to claim 4, wherein said first boiling point is between 50 C and 120 C.

8. The cooling device according to claim 5, wherein said second boiling point is between 20 C and 40 C.

9. The cooling device according to claim 1, further comprising
at least one compressibly deformable thermal interface material attached to the outer chamber, so as to allow said at least one thermally conducting section to thermally contact said heat source.

10. The cooling device according to claim 1, wherein the outer chamber further comprises a wicking structure extending over an inner area of the outer chamber.

11. The cooling device according to claim 1, wherein
an average thickness of a material forming the outer chamber is between 50 µm and 1000 µm.

12. The cooling device according to claim 11, wherein said material forming the outer chamber is a metal alloy.

13. A computer hardware apparatus comprising:
a support with at least one electronic component, and
at least one cooling device according to claim 1, wherein said at least one thermally conducting section is in thermal communication with said at least one electronic component.

14. The computer hardware apparatus according to claim 13, wherein:
said at least one section of the cooling device is a thermally conducting, deformable section, and is deformable upon a pressure increase in the outer chamber, and wherein the at least one deformable section comprises one or more hinges and is connected to a remaining section of the outer chamber by said one or more hinges, said remaining section being substantially less deformable than said at least one deformable section,
the apparatus further comprising:
a compressibly deformable thermal interface material attached to the outer chamber of the cooling device vis-à-vis said at least one deformable section, such that the latter is in thermal communication with said at least one electronic component via said thermal interface material, and wherein,
said at least one deformable section is deformable upon a pressure increase in the outer chamber so as to compress said thermal interface material at the level of said at least one electronic component.

15. The computer hardware apparatus according to claim 14, wherein:
said support comprises a set of electronic components,
said outer chamber of said cooling device comprises a set of thermally conducting, deformable sections, wherein:
each of said deformable sections comprises one or more hinges and is connected to the remaining section of the outer chamber by said one or more hinges, said remaining section being substantially less deformable than each of said deformable sections; and
said deformable sections are suitably arranged for thermally contacting respective heat sources,
and wherein:
each of said deformable sections is in thermal communication with a respective one of the electronic components via a respective portion of the thermal interface material; and
each of said deformable sections is deformable upon a pressure increase in the outer chamber, so as to compress a respective portion of the thermal interface material at the level of a respective one of the electronic components.

16. The computer hardware apparatus according to claim 14, wherein
said support comprises a set of electronic components and wherein said outer chamber of said cooling device comprises a set of thermally conducting, deformable sections, wherein:
each of said deformable sections comprises one or more hinges and is connected to the remaining section of the outer chamber by said one or more hinges, said remaining section being substantially less deformable than each of said deformable sections; and
said deformable sections are suitably arranged for thermally contacting respective heat sources,
and wherein:
the apparatus further comprises a set of compressibly deformable thermal interface materials attached to the outer chamber of the cooling device vis-à-vis each of the deformable sections, such that each of the deformable sections is in thermal communication with a respective one of the electronic components via a respective one of the thermal interface materials; and
each of said deformable sections is deformable upon a pressure increase in the outer chamber so as to compress a respective one of the thermal interface materials at the level of a respective one of the electronic components.

17. The computer hardware apparatus according to claim 13, wherein
the outer chamber of the cooling device comprises several inner chambers, each nested in the outer chamber and expandable in volume upon a pressure increasing therein.

18. The computer hardware apparatus according to claim 13, wherein the apparatus comprises:
a stack of at least two supports, each having at least one electronic component, and wherein:
said at least one thermally conducting section of said cooling device is in thermal communication with at least one electronic component of one of the two supports, and the two supports and the at least one cooling device are mounted in the apparatus, so as for said one of the two supports and the cooling device to be removable in isolation from the other one of the two supports.

* * * * *